US008506713B2

(12) United States Patent
Takagi

(10) Patent No.: US 8,506,713 B2

(45) Date of Patent: Aug. 13, 2013

(54) FILM DEPOSITION APPARATUS AND FILM DEPOSITION METHOD

(75) Inventor: Toshio Takagi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 484 days.

(21) Appl. No.: 12/677,664

(22) PCT Filed: Sep. 3, 2008

(86) PCT No.: PCT/JP2008/065883
§ 371 (c)(1),
(2), (4) Date: May 20, 2010

(87) PCT Pub. No.: WO2009/034898
PCT Pub. Date: Mar. 19, 2009

(65) Prior Publication Data

US 2010/0279008 A1 Nov. 4, 2010

(30) Foreign Application Priority Data

Sep. 12, 2007 (JP) ................................ 2007-237055
Mar. 25, 2008 (JP) ................................ 2008-078824

(51) Int. Cl.
*C23C 16/455* (2006.01)
*C23C 16/458* (2006.01)
*C23C 16/46* (2006.01)
*C23C 16/06* (2006.01)
*C23C 16/22* (2006.01)

(52) U.S. Cl.
USPC ...... 118/715; 118/728; 118/729; 156/345.29; 156/345.33; 156/345.34; 156/345.37; 156/345.54

(58) Field of Classification Search
USPC .................... 118/715, 728, 729; 156/345.29, 156/345.33, 345.34, 345.37, 345.54
See application file for complete search history.

(56) References Cited

U.S. PATENT DOCUMENTS 4,842,683 A * 6/1989 Cheng et al. ............. 156/345.37
5,210,466 A * 5/1993 Collins et al. ............ 315/111.21

(Continued)

FOREIGN PATENT DOCUMENTS

JE 2007-059782 3/2007
JP 1-302816 12/1989

(Continued)

OTHER PUBLICATIONS

International Search Report mailed Sep. 30, 2008 for International Application No. PCT/JP2008/065883.

(Continued)

*Primary Examiner* — Rudy Zervigon

(74) *Attorney, Agent, or Firm* — Smith, Gambrell & Russell, LLP

(57) ABSTRACT

The present invention is a film deposition apparatus configured to deposit a film on a substrate that has been loaded into a vacuum container via a transfer opening and placed on a table in the vacuum container, by supplying a process gas to the substrate from a process-gas supply part opposed to the table under a vacuum atmosphere, while heating a table surface of the table, the film deposition apparatus comprising: an elevating mechanism configured to vertically move the table between a process position at which the substrate is subjected to a film deposition process, and a transfer position at which the substrate is transferred to and from an external transfer mechanism that has entered from the transfer opening; a surrounding part configured to surround the table with a gap therebetween, when the table is located at the process position, so that the surrounding part and the table divide an inside of the vacuum container into an upper space, which is located above the table, and a lower space, which is located below the table; a vacuum exhaust conduit in communication with the upper space, through which a process atmosphere in the upper space is discharged to create a vacuum in the upper space; a heating unit configured to heat a gas contact region ranging from the upper space to the vacuum exhaust conduit, to a temperature higher than a temperature allowing adhesion of reactant; and a heat insulation part disposed between the heating unit and a lower part of the vacuum container surrounding the lower space.

13 Claims, 10 Drawing Sheets

1 47 68 52 54 212 a b 40 300 27 214 31 36 211 263 262 W 32 34 361 261 26 22 35 223 221 24 222 b a 23

(56) References Cited

U.S. PATENT DOCUMENTS 5,304,279 A * 4/1994 Coultas et al. .......... 156/345.49
5,314,574 A * 5/1994 Takahashi .................... 438/706
5,338,363 A * 8/1994 Kawata et al. ............... 118/725
5,352,294 A * 10/1994 White et al. ................. 118/725
5,366,585 A * 11/1994 Robertson et al. ............. 216/67
5,425,812 A * 6/1995 Tsutahara et al. ........... 118/725
5,445,677 A * 8/1995 Kawata et al. ............... 118/724
5,518,547 A * 5/1996 Barnes et al. ......... 118/723 MA
5,534,073 A * 7/1996 Kinoshita et al. ............ 118/728
5,556,474 A * 9/1996 Otani et al. ............... 118/723 E
5,556,501 A * 9/1996 Collins et al. ........... 156/345.38
5,582,866 A * 12/1996 White ........................ 427/248.1
5,669,976 A * 9/1997 Yuuki et al. .................. 118/725
5,884,009 A * 3/1999 Okase .......................... 392/418
5,895,530 A * 4/1999 Shrotriya et al. ............ 118/715
5,976,260 A * 11/1999 Kinoshita et al. ............ 118/719
6,022,811 A * 2/2000 Yuuki et al. .................. 438/758
6,024,826 A * 2/2000 Collins et al. ........... 156/345.37
6,054,013 A * 4/2000 Collins et al. ........... 156/345.27
6,063,233 A * 5/2000 Collins et al. ........... 156/345.37
6,074,512 A * 6/2000 Collins et al. ........... 156/345.29
6,077,384 A * 6/2000 Collins et al. ........... 156/345.29
6,095,083 A * 8/2000 Rice et al. .................. 118/723 I
6,095,084 A * 8/2000 Shamouilian et al. .... 118/723 E
6,165,311 A * 12/2000 Collins et al. ........... 156/345.26
6,176,929 B1 1/2001 Fukunaga et al.
6,183,564 B1 * 2/2001 Reynolds et al. ............ 118/719
6,261,408 B1 * 7/2001 Schneider et al. ....... 156/345.26
6,291,800 B1 * 9/2001 Shirakawa et al. .......... 219/390
6,357,385 B1 * 3/2002 Ohmi et al. ........... 118/723 AN
6,409,837 B1 * 6/2002 Hillman ....................... 118/712
6,444,039 B1 * 9/2002 Nguyen ....................... 118/715
6,503,331 B1 * 1/2003 Yudovsky et al. ........... 118/720
6,582,522 B2 * 6/2003 Luo et al. ..................... 118/715
6,586,343 B1 * 7/2003 Ho et al. ...................... 438/758
6,663,714 B2 * 12/2003 Mizuno et al. ............... 118/719
6,676,761 B2 * 1/2004 Shang et al. ................. 118/728
6,790,311 B2 * 9/2004 Collins et al. ........... 156/345.48
6,806,211 B2 * 10/2004 Shinriki et al. .............. 438/785
6,890,596 B2 * 5/2005 Sarigiannis et al. ....... 427/248.1
6,899,764 B2 * 5/2005 Frijlink ........................ 118/719
6,955,741 B2 * 10/2005 Yamagishi .............. 156/345.51
7,138,336 B2 * 11/2006 Lee et al. ..................... 438/680
7,267,725 B2 * 9/2007 Kawano ....................... 118/719
7,276,123 B2 * 10/2007 Shimizu et al. .............. 118/719
7,312,415 B2 * 12/2007 Ohmi et al. ............. 219/121.43
7,422,636 B2 * 9/2008 Ishizaka ....................... 118/719
7,468,104 B2 * 12/2008 Mardian et al. .............. 118/715
7,498,057 B2 * 3/2009 Sarigiannis et al. ....... 427/248.1
7,628,863 B2 * 12/2009 Sen et al. ..................... 118/715
7,651,583 B2 * 1/2010 Kent et al. ............... 156/345.31
7,654,010 B2 * 2/2010 Moriya et al. ................. 34/449
7,662,233 B2 * 2/2010 Sneh ........................... 118/724
7,670,432 B2 * 3/2010 Li ............................... 118/715
7,794,546 B2 * 9/2010 Li ............................... 118/733
7,993,457 B1 * 8/2011 Krotov et al. ................ 118/719
8,012,261 B2 * 9/2011 Sneh ........................... 118/733
8,092,598 B2 * 1/2012 Baek et al. ................... 118/715
8,092,606 B2 * 1/2012 Park et al. .................... 118/728
8,133,322 B2 * 3/2012 Nakamura et al. ........... 118/715
8,152,925 B2 * 4/2012 Iizuka .......................... 118/715
8,216,380 B2 * 7/2012 White et al. ................. 118/729
8,287,648 B2 * 10/2012 Reed et al. ................... 118/719
2001/0042514 A1 * 11/2001 Mizuno et al. ............... 118/728
2002/0036065 A1 * 3/2002 Yamagishi et al. .......... 156/345
2003/0000647 A1 * 1/2003 Yudovsky et al. ....... 156/345.51
2003/0143328 A1 * 7/2003 Chen et al. .............. 427/255.28
2004/0221808 A1 * 11/2004 Kawano ....................... 118/715
2005/0022737 A1 * 2/2005 Shimizu et al. .............. 118/715
2005/0074983 A1 4/2005 Shinriki et al.
2005/0252449 A1 11/2005 Nguyen
2005/0268856 A1 * 12/2005 Miller et al. ................. 118/729
2005/0269030 A1 * 12/2005 Kent et al. ............... 156/345.31
2005/0271812 A1 12/2005 Myo et al.
2005/0271813 A1 12/2005 Kher et al.
2006/0137608 A1 * 6/2006 Choi et al. ................... 118/715
2006/0213439 A1 * 9/2006 Ishizaka ....................... 118/715
2006/0225649 A1 * 10/2006 Courville ..................... 118/715
2006/0276037 A1 * 12/2006 Lee et al. ..................... 438/681
2007/0028838 A1 * 2/2007 Bercaw et al. ............... 118/715
2007/0116873 A1 * 5/2007 Li et al. ..................... 427/248.1
2007/0269983 A1 * 11/2007 Sneh ........................... 438/689
2008/0041307 A1 2/2008 Nguyen et al.
2008/0044569 A1 2/2008 Myo et al.
2008/0308134 A1 * 12/2008 Maeda et al. ................ 134/137
2009/0133835 A1 5/2009 Nishimoto et al.
2010/0173432 A1 * 7/2010 White et al. ................... 438/17
2012/0009765 A1 * 1/2012 Olgado ........................ 438/478

FOREIGN PATENT DOCUMENTS

JP 11-158632 6/1999
JP 2003-231970 8/2003
JP 2004-6733 1/2004
JP 2006-299294 11/2006
JP 2007-142363 6/2007
WO 2005/113852 5/2005

OTHER PUBLICATIONS

PCT Notification of Transmittal of Translation of the International Preliminary Examination Report (Form PCT/IB/338) mailed Apr. 8, 2010.
PCT International Preliminary Report on Patentability (Form PCT/IB/373) mailed Apr. 8, 2010.
PCT Written Opinion of the International Searching Authority (Form/ISA/237) mailed Apr. 8, 2010.

* cited by examiner

FILM DEPOSITION APPARATUS AND FILM DEPOSITION METHOD

FIELD OF THE INVENTION

The present invention relates to a technique for supplying a process gas to a substrate under vacuum atmosphere, so as to deposit, on the substrate, a film of a reaction product of the process gas.

BACKGROUND ART

As a film deposition method in a semiconductor manufacturing process, there has been known a method for depositing a film on a substrate, which makes, under vacuum atmosphere, a semiconductor wafer (hereinafter referred to as "wafer"), which is a substrate, adsorb a first process gas (material gas) on its surface, then switches a gas to be supplied from the first process gas to a second process gas (reaction gas) so as to form one or more atomic layers and molecular layers by the reaction of the first and second gases, and repeats this cycle plural times so as to stack these layers. This film deposition method, which is referred to as, e.g., an ALD (Atomic Layer Deposition) method or an MLD (Molecular Layer Deposition) method, can precisely control a film thickness depending on the number of cycles, and can provide an excellent film quality, i.e., a high in-plane uniformity. Thus, such a film deposition method is an effective method capable of coping with a thinner film of a semiconductor device.

For example, JP2004-6733 A (particularly paragraph 0056 and FIG. 8) describes a film deposition apparatus for carrying out this film deposition method, wherein a film is deposited on a surface of a substrate placed in a process container (vacuum container) by alternately flowing two kinds of process gases from a left side surface of the process container to a right side surface thereof (or from the right side surface to the left side surface). When there is employed such a side flow method in which a process gas is flown from one side to the other side of a substrate, lateral non-uniformity of a film thickness and of a film quality can be restrained. Thus, such a film deposition process can be performed under a relatively low temperature atmosphere such as about 200° C.

For example, when a high dielectric constant material such as zirconium oxide ($ZrO_2$) is deposited, a TEMAZ (tetrakis ethyl methyl amino zirconium) gas is used as the first process gas (material gas), and an ozone gas is used as the second process gas (reaction gas). Since a decomposition temperature of the TEMAZ gas is high, a film deposition process is performed at a temperature as high as, e.g., 280° C. However, under this high temperature condition, since a reaction speed is also high, a film thickness of a film deposited during one cycle tends to be thicker. In particular, in the side flow method, since a moving distance of a gas on the surface of the substrate is long, there is a possibility that a film thickness might be large on a gas supply side, but might be small on an exhaust side. In this case, an excellent in-plane uniformity of the film thickness cannot be obtained.

In addition, when a supply time of an ozone gas as a reaction gas is reduced in order to improve a throughput, for example, an oxidation ability of the ozone gas becomes weaker at a point more distant from a supply source of the ozone gas (ozone gas is consumed). Thus, there is a possibility that the high dielectric constant material adsorbed on the substrate might not be oxidized in a sufficiently uniform manner. In this case, values of leak currents of semiconductor devices formed in the wafer may be deviated.

In order to solve the above disadvantage of the side flow method, the following method is under review. Namely, by using a gas showerhead (see JP2006-299294A (particularly paragraphs 0021 to 0026)) for use in a general CVD apparatus, for example, a process gas is supplied from above a central part of a substrate, and a non-reacted process gas and a reaction byproduct are discharged from a bottom part of a process container. In this type of gas supply-and-discharge method, the process gas to be supplied flows from the center of the substrate toward a periphery thereof. Thus, a moving distance of the gas becomes shorter than that in the side flow method, so that a high in-plane uniformity of a film thickness and of a film quality of the deposited film can be expected after the film deposition.

It has been found that, in order to perform a satisfactory film deposition process by the above type of method that supplies a process gas with the use of the showerhead, it is advantageous that the substrate and the showerhead are close to each other, so as to make narrow a process atmosphere space between the substrate and the showerhead. However, when the substrate is brought excessively close to the showerhead, there is not left enough room in which the substrate is transferred between an external transfer mechanism and a stage on which the substrate is to be placed.

Further, when a transfer opening is formed on a lateral side of the process atmosphere in a sidewall of the process vessel, the atmosphere surrounding the substrate is made asymmetric in the in-plane direction of the substrate, when viewed from the center of the process atmosphere. This inhibits the in-plane uniformity of the process. Thus, the transfer opening should be formed at a position lower than the process atmosphere. In order therefor, the process container is required to have a sufficient height allowing that the stage is moved upward and downward between a position at which the substrate is processed and a position at which the substrate is transferred.

Furthermore, in order that a reactant such as a reaction product and a reaction byproduct does not deposit on an inner wall of the process container, it is necessary to heat an area thereof, with which the process gas comes into contact, to a temperature (evaporation temperature of the reactant) higher than a temperature allowing adhesion of the reactant. Generally, in a process container of a single-wafer type for a CVD process, an inner wall of the process container is heated at a temperature of 200° C. at most. However, when a high dielectric constant material such as Zr oxide and St oxide is used, a temperature allowing evaporation of the reactant is much higher. Thus, an area of the process container ranging from a portion of the sidewall near to the process atmosphere to the bottom wall, including the transfer opening below the portion of the sidewall, should be heated to, e.g., about 280° C.

However, when the entire process container is heated to such a high temperature, a grease of a drive system for moving the stage upward and downward, a grease of another drive system for driving a gate valve of the transfer opening though which a substrate is loaded, and an O-ring, which is a sealing member made of a resin, for hermetically closing the process container, are deteriorated. In addition, since a heat resistance of a commercially available manometer is about 200° C. at most, it becomes difficult to measure a pressure in the process container. Moreover, the enlarged size of the process container for securing a space required for the vertical movement of the stage is disadvantageous in that a larger amount of energy is necessary for heating the entire process container to such a high temperature.

SUMMARY OF THE INVENTION

The present invention has been made in view of the above circumstances, so as to effectively solve these problems. The object of the present invention is to provide a film deposition apparatus and a film deposition method capable of achieving a high in-plane uniformity of a film thickness and an excellent film quality, and of preventing thermal deterioration of the apparatus.

The present invention is a film deposition apparatus configured to deposit a film on a substrate that has been loaded into a vacuum container via a transfer opening and placed on a table in the vacuum container, by supplying a process gas to the substrate from a process-gas supply part opposed to the table under a vacuum atmosphere, while heating a table surface of the table, the film deposition apparatus comprising: an elevating mechanism configured to vertically move the table between a process position at which the substrate is subjected to a film deposition process, and a transfer position at which the substrate is transferred to and from an external transfer mechanism that has entered from the transfer opening; a surrounding part configured to surround the table with a gap therebetween, when the table is located at the process position, so that the surrounding part and the table divide an inside of the vacuum container into an upper space, which is located above the table, and a lower space, which is located below the table; a vacuum exhaust conduit in communication with the upper space, through which a process atmosphere in the upper space is discharged to create a vacuum in the upper space; a heating unit configured to heat a gas contact region ranging from the upper space to the vacuum exhaust conduit, to a temperature higher than a temperature allowing adhesion of reactant; and a heat insulation part disposed between the heating unit and a lower part of the vacuum container surrounding the lower space.

According to the present invention, since the gas and the reactant in the process atmosphere is difficult to flow therefrom into the lower space, it is not necessary to heat the lower part of the process container to a high temperature in order to prevent the adhesion of the reactant. In addition, since the lower part of the process container is thermally separated by the heat insulation part from an upper part thereof, which is required to be heated to a high temperature, the lower part can be maintained at, e.g., a normal temperature. Thus, it is possible to eliminate deterioration of a grease of a drive system for vertically moving the table and of a grease of another drive system for a gate valve of the transfer opening. Further, difficulty in measuring a pressure in the vacuum container, which may be caused by a heat resistance limit of a manometer, can be eliminated. Furthermore, since it is not necessary to heat the entire vacuum container, an amount of energy required for heating can be reduced.

Preferably, the lower space is provided with a purge-gas supply conduit through which a purge gas is supplied, and the purge gas is configured to flow into the upper space via the gap between the table and the surrounding part.

In addition, for example, the surrounding part is formed of an annular projecting part annularly projecting inward from an inner wall of the vacuum container, the surrounding part being configured to be located near to a side peripheral surface of the table so as to surround the same, when the table is located at the process position.

In addition, for example, a part of the vacuum exhaust conduit defines an exhaust duct disposed along a circumference of the upper space, and an exhaust port into which an exhaust flow from the upper space flows is formed in the exhaust duct in a circumferential direction of the upper space.

In this case, preferably, the exhaust duct is formed to have an annular shape surrounding the upper space. In addition, preferably, the exhaust port is formed to have a laterally extending slit-like shape. In addition, preferably, an exhaust pipe for vacuum evacuation is connected to the exhaust duct. In addition, preferably, a heat insulation member as the heat insulation part is disposed on a lower surface of the exhaust duct.

In addition, preferably, the lower part of the vacuum container is formed as a flat lower container having an upper opening.

In addition, for example, a member, which is positioned immediately above the lower container so as to constitute an upper part of the vacuum container, is in contact with an inward area of an upper end surface of the lower container via a sealing member, and a gap forming an air layer constituting the heat insulation part is formed between the member constituting the upper part of the vacuum container and an outward area of the upper end surface of the lower container.

In addition, for example, a temperature of the region to be heated by the heating unit is 230° C. or more.

In addition, for example, the upper space is provided with a member for lowering a flow conductance to the vacuum exhaust conduit so as to uniformize the exhaust flow.

In addition, for example, the table includes a table body, and a cover member capable of being removably laid on the table body.

The present invention can be applied to a method for depositing a film by the aforementioned ALD (or MLD) method. Namely, in the film deposition apparatus according to the present invention, supplying a material gas as a process gas so as to cause the gas to be adsorbed on the substrate, and supplying a reaction gas as a process gas reactable with the material gas so as to generate a reaction product on the substrate, are alternately performed. In addition, between the supply of the material gas and the supply of the reaction gas, supplying a purge gas as a process gas so as to purge the process atmosphere may be performed.

In addition, the present invention can be applied to a CVD (Chemical Vapor Deposition).

In addition, the present invention is a film deposition method that supplies a process gas to a substrate placed on a table in a vacuum container under a vacuum atmosphere, the film deposition method comprising: transferring the substrate by an external transfer mechanism to the table located at a transfer position via a transfer opening formed in a sidewall of the vacuum container; elevating the table from the transfer position to a process position, so that a surrounding part surrounding the table with a gap therebetween and the table located at the process position divide an inside of the vacuum container into an upper space, which is located above the table, and a lower space, which is located below the table, heating the substrate to a film deposition temperature and supplying a process gas to the substrate from above the substrate; discharging a process atmosphere in the upper space through a vacuum exhaust conduit in communication with the upper space to create a vacuum in the upper space; and heating a gas contact region ranging from the upper space to the vacuum exhaust conduit, to a temperature higher than a temperature allowing adhesion of reactant, while a heating unit heating the gas contact region ranging from the upper space to the vacuum exhaust conduit, and a lower part of the vacuum container surrounding the lower space are thermally insulated from each other.

Preferably, the film deposition method according to the present invention further comprises supplying a purge gas to the lower space in order to prevent the process atmosphere from entering the lower space.

In addition, the present invention is the computer program includes steps for performing the film deposition method having the aforementioned features.

BEST MODE FOR CARRYING OUT THE INVENTION

A structure of a film deposition apparatus in one embodiment of the present invention will be described herebelow with reference to FIGS. 1 to 4. In the film deposition apparatus 1 in this embodiment, for example, a material gas containing strontium (Sr) (hereinafter referred to as "Sr material") and a material gas containing titanium (Ti) (hereinafter referred to as "Ti material") are used as a first process gas, and an ozone gas as a reaction gas is used as a second process gas. The film deposition apparatus 1 reacts these process gases with each other by an ALD process, whereby a film made of strontium titanate ($SrTiO_3$ (hereinafter abbreviated to "STO")), which is a high dielectric constant material, is deposited on a surface of a wafer as a substrate.

Figure 1:
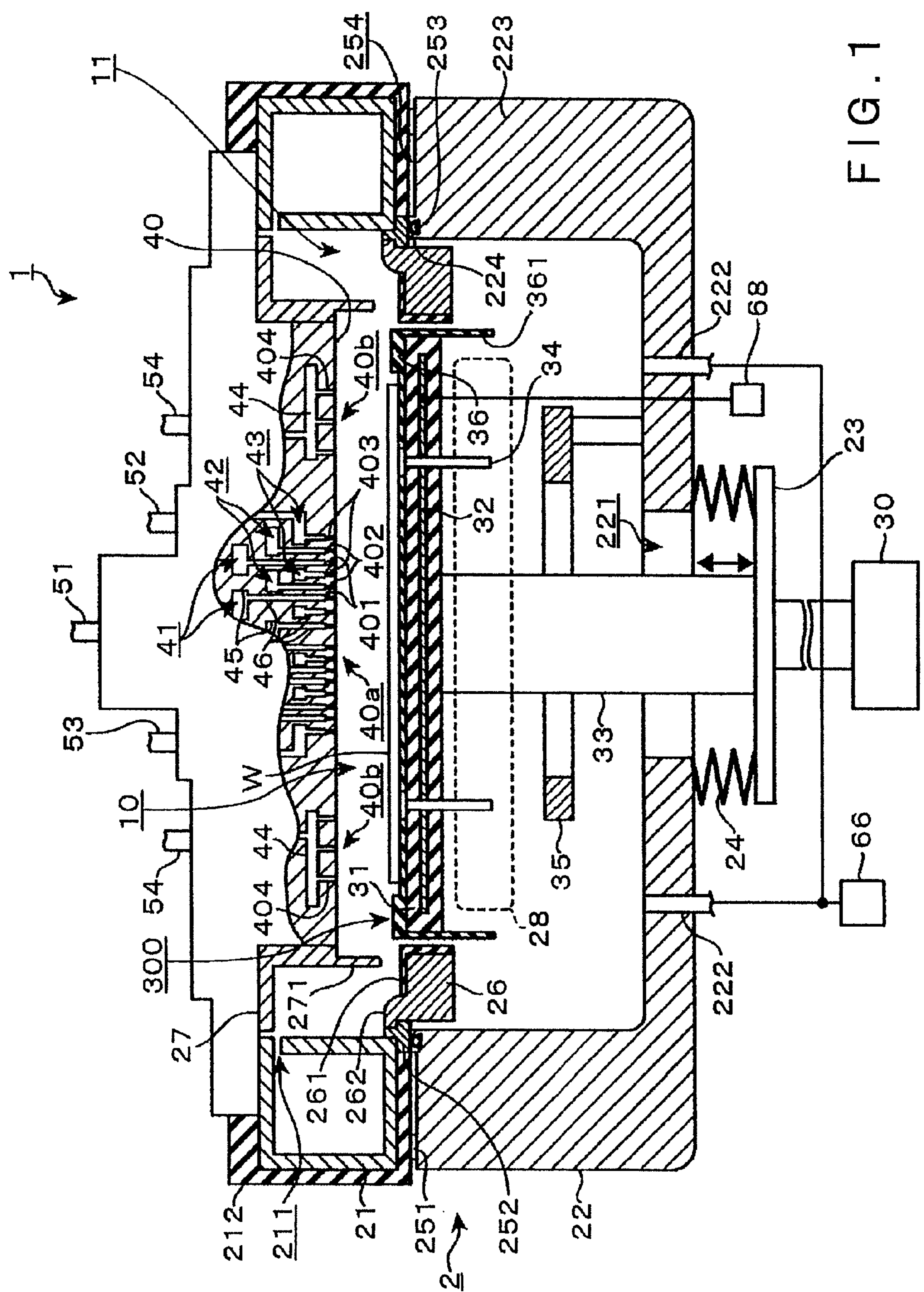
FIG. 1 is a longitudinal sectional view of a film deposition apparatus in one embodiment of the present invention.

As shown in the longitudinal sectional view of FIG. 1, the film deposition apparatus 1 includes: a process container 2 forming a vacuum container; a stage 31 disposed in the process container 2, the stage 31 constituting a table on which a wafer W as a substrate can be placed; and a gas showerhead 40 disposed in an upper part of the process container 2 so as to be opposed to the stage 31, the gas showerhead 40 constituting a process-gas supply part. In this embodiment, the stage 31 is covered with a stage cover 36, which will be described below. Thus, in detail, the stage 31 corresponds to a table body, and the stage 31 and the stage cover 36 corresponds to a table 300.

The stage 31 is made of, e.g., aluminium nitride or quartz, and is formed to have a flat discoid shape, for example. Embedded in the stage 31 is a stage heater 32 configured to heat a table surface of the table 300 so as to heat the wafer W to a film deposition temperature. The stage heater 32 is formed of, e.g., a sheet-like heating resistor, and is capable of heating a wafer W placed on the stage 31 to, e.g., 280° C., by means of an electric power supplied from a power supply part 68. Further, an electrostatic chuck, not shown, is disposed in the stage 31. Thus, the wafer W placed on the stage 31 can be electrostatically fixed.

The stage 31 is supported by a columnar support member 33 on a lower central part of the stage 31. The support member 33 is adapted to be vertically moved (moved upward and downward) (elevated and lowered) by an elevating mechanism 30. By vertically moving the support member 33, the stage 31 can be vertically moved along a distance of 80 mm at maximum, between a process position at which the wafer W is processed by a process gas, and a transfer position at which the wafer W is transferred to and from an external transfer mechanism.

As shown in FIG. 1, the support member 33 passes through a bottom part of the process container 2, in more detail, through a bottom part of a lower container 22 defining a lower part, which will be described below, so as to be connected to an elevating plate 23 that is vertically moved by the aforementioned elevating mechanism 30. A space between the elevating plate 23 and the lower container 22 is hermetically sealed by a bellows 24.

In addition, the stage 31 has a plurality of, e.g., three elevating pins 34 for vertically moving the wafer W on the surface of the stage 31 while supporting a rear surface of the wafer W. For example, as shown in FIG. 1, in a state where the stage 31 is located at the process position for the wafer W, the respective elevating pins 34 pass vertically through the stage 31 such that flat head parts of the elevating pins 34 stop at the upper surface of the stage 31, and that lower end parts thereof project from the bottom surface of the stage 31.

A ring-shaped elevating member 35 is disposed below the elevating pins 34 passing through the stage 31. In a state where the stage 31 is lowered and located at the transfer position for the wafer W, when the elevating member 35 is vertically moved, the respective elevating pins 34 are vertically moved similarly. Thus, the wafer W supported by the elevating pins 34 can be vertically moved above the table surface of the stage 31.

In order to prevent deposit of reactant onto the stage 31, an upper surface and a side surface of the stage 31 is covered with the stage cover 36 which is a removable cover member (called "deposit shield" or the like) made of, e.g., quartz. A circular recess, whose diameter is slightly larger than that of the wafer W, is formed in a central area of an upper surface of the stage cover 36. Thus, the wafer W can be easily placed in position on the table surface of the stage cover 36.

Openings (through-hole enlarged parts) for receiving the head parts of the elevating pins 34 are formed in the upper surface of the stage cover 36 at positions corresponding to the elevating pins 34. Thus, as shown in FIG. 1, when the stage 31 is moved and located at the process position for the wafer W, the upper surface of the stage cover 36 and the upper surfaces of the head parts of the respective elevating pins 34 are substantially coplanar with each other, whereby the flat table surface for the wafer W is formed in the upper surface of the stage 31. Further, as shown in FIG. 1, a sidewall part of the stage cover 36 is extended below the stage 31 so as to form a skirt part 361 that surrounds an area below the stage 31 from a lateral side. The skirt part 361 together with a body of the stage 31 defines a side peripheral surface of the stage 31.

Next, the gas showerhead 40 is described. As shown in FIG. 1, the gas showerhead 40 as a member for constituting a top wall of the process container 2 is incorporated in the film deposition apparatus 1 such that the gas showerhead 40 is opposed to the stage 31. A process atmosphere 10, in which a wafer W is subjected to a film deposition process, is formed in a space between the gas showerhead 40 and the wafer W.

The gas showerhead 40 is formed by combining a plurality of aluminum discoid members and/or annular members, for example, although illustration of each member is omitted. These members are previously provided with grooves and/or apertures. As shown in FIG. 1, the grooves and/or apertures are combined with each other, so that gas supply holes 401 to

404, gas supply spaces 41 to 44, and gas passages 46 connecting these holes and spaces, are formed inside the gas showerhead 40.

In more detail, as shown in FIG. 1, the gas showerhead 40 is divided into a central area 40*a* opposed to the central part of the wafer W and a peripheral area 40*b* opposed to the peripheral part of the wafer W. A function of the showerhead 40 in the central area 40*a* is to supply the respective material gases (Sr material, Ti material), a reaction gas (ozone gas), and a purge gas (Ar gas), into the process atmosphere 10. On the other hand, a function of the showerhead 40 in the peripheral area 40*b* is to supply only a purge gas.

As shown in FIG. 1, inside the showerhead 40 in the central area 40*a*, there are vertically, separately stacked gas-supply spaces 41 to 43 for independently supplying the respective gases into the gas supply holes 401 to 403.

Each of the gas supply spaces 41 to 43 is a flat cylindrical space, for example. A number of narrow columnar members 45 extending from a ceiling surface of the space to a floor surface thereof are disposed in the space. However, the space is basically communicated (not divided) in the horizontal direction. The gas passages 46 for the other gases relating to the other gas supply spaces are formed inside the columnar member 45. Another function of the columnar member 45 is to improve heat transmission in the gas showerhead 40.

A function of the uppermost Sr-material supply space 41 among the gas supply spaces 41 to 43 is to supply a Sr material and a purge gas to the Sr-material supply holes 401. A function of the middle Ti-material supply spaces 42 is to supply a Ti material and a purge gas to the Ti-material supply holes 402. An ozone gas and a purge gas are supplied from the lowermost ozone-gas supply space 43 to the ozone-gas supply holes 403.

The respective gases having passed through the gas supply holes 401 to 403 are supplied to the process atmosphere 10 above the central part of the wafer W placed on the stage 31. Namely, the gas showerhead 40 is structured as a gas supply part of a post-mix type, for independently supplying the Sr material, the Ti material, and the ozone gas, into the process container 2.

On the other hand, formed inside the gas showerhead 40 in the peripheral area 40*b* is a purge-gas supply space 44 which is an annular space surrounding the gas supply spaces 41 to 43 of the aforementioned central area 40*a*. A function of the purge-gas supply space 44 is to supply a purge gas to purge-gas supply holes 404. The purge gas having passed through the purge-gas supply holes 404 is supplied to the process atmosphere 10 above the peripheral part of the wafer W placed on the stage 31.

Figure 3:
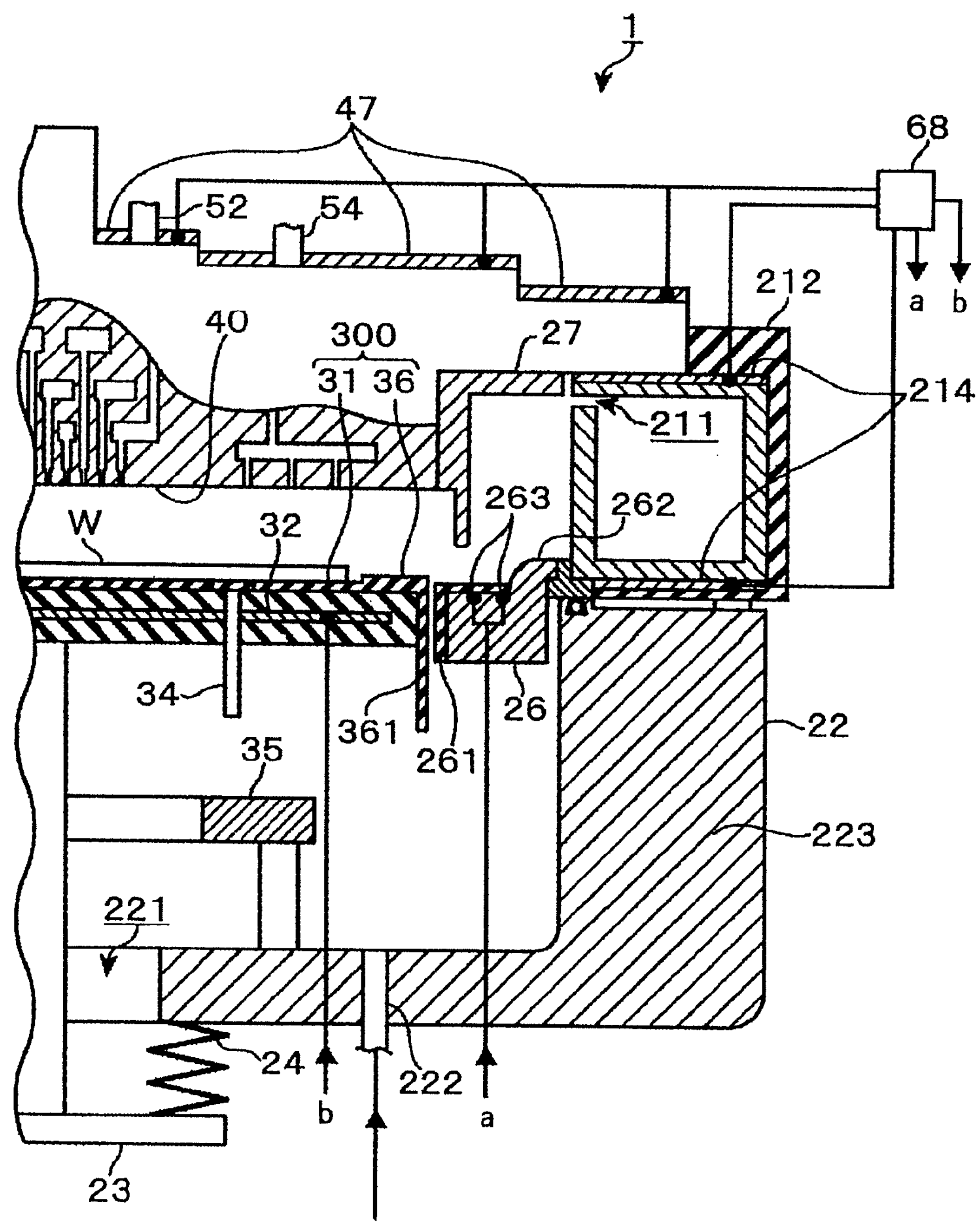
FIG. 3 is a partially enlarged longitudinal sectional view of the film deposition apparatus shown in FIG. 1.
Figure 4:
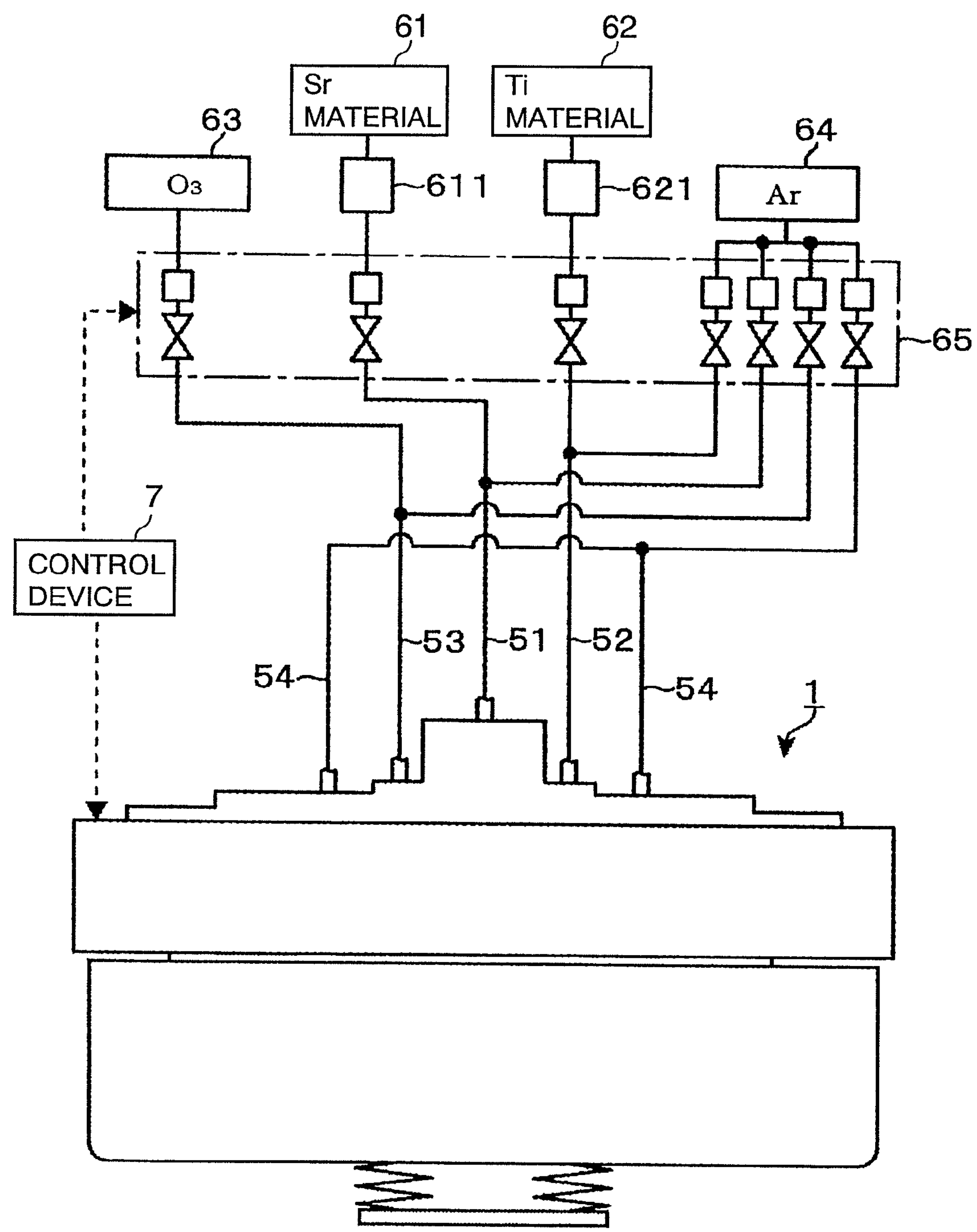
FIG. 4 is a schematic view of gas supply paths of the film deposition apparatus shown in FIG. 1.

As shown in FIG. 3, an upper surface of the gas showerhead 40 is covered with a showerhead heater 47 constituting a part of a heating unit. In this embodiment, the showerhead heater 47 is formed of a sheet-like heating resistor, and is capable of heating the entire gas showerhead 40 by means of an electric power supplied from the power supply part 68. As a result, a lower surface of the gas showerhead 40, which is exposed to the process atmosphere 10 in which the process gases flow, is heated to, e.g., 250° C. or more. Thus, reactants of the process gases can be prevented from adhering to the lower surface of the showerhead 40. As a matter of convenience, illustration of the showerhead heater 47 is omitted excluding FIG. 3.

As shown in FIG. 1, gas supply conduits 51 to 54 for supplying the respective gases to the respective gas supply spaces 41 to 44 are connected to the upper surface of the gas showerhead 40. Specifically, the Sr-material supply space 41 is connected to the Sr-material supply conduit 51. The Ti-material supply space 42 is connected to the Ti-material supply conduit 52. The ozone-gas supply space 43 is connected to the ozone-gas supply conduit 53. The purge-gas supply space 44 is connected to the purge-gas supply conduit 54. As shown in the gas supply paths of FIG. 4, these gas supply conduits 51 to 54 are respectively connected to respective gas supply sources 61 to 64 on an upstream side.

In more detail, the Sr-material supply conduit 51 is connected to the Sr-material supply source 61 that stores a liquid Sr material such as $Sr(THD)_2$ (strontium bistetra methyl heptanedionato) and $Sr(Me5Cp)_2$ (bis pentamethyl cyclopenta dienyl strontium). The Sr material is extruded to the supply conduit, and is evaporated by an evaporator 611. Then, the evaporated Sr material is supplied to the Sr-material supply conduit 51.

The Ti-material supply conduit 52 is connected to the Ti-material supply source 62 that stores a Ti material such as $Ti(OiPr)_2(THD)_2$ (titanium bis-isopropoxide bistetra methyl heptanedionato) and Ti(OiPr) (titanium tetra isopropoxide). Similarly to the Sr material, the Ti material is extruded to the supply conduit, and is evaporated by an evaporator 621. Then, the evaporated Ti material is supplied to the Ti-material supply conduit 52.

The ozone-gas supply conduit 53 is connected to the ozone-gas supply source 63 formed of, e.g., a well-known ozonizer. The purge-gas supply conduit 54 is connected to the purge-gas supply source 64 formed of an argon-gas cylinder. Thus, an ozone gas and an argon gas can be supplied to the respective supply conduits 53 and 54.

The Sr-material supply conduit 51, the Ti-material supply conduit 52, and the ozone-gas supply conduit 53 are branched, and the respective branched ducts are connected to the purge-gas supply source 64. Thus, a purge gas, instead of the respective process gases, can be supplied from the respective gas supply conduits 51 to 53. In addition, disposed between the gas supply conduits 51 to 54 and the gas supply sources 61 to 64 is a flow-rate controller group 65 composed of valves and flowmeters. Thus, based on a command from a control device 7, which will be described below, supply rates of the respective gases can be controlled.

Next, a structure of the process container 2 is described. In order to solve the problems such as the deterioration of greases of drive systems for the respective parts and the heat resistance limit of a manometer, the process container 2 is designed such that a heating area thereof is small as much as possible. This structure is described herebelow in detail.

Figure 2:
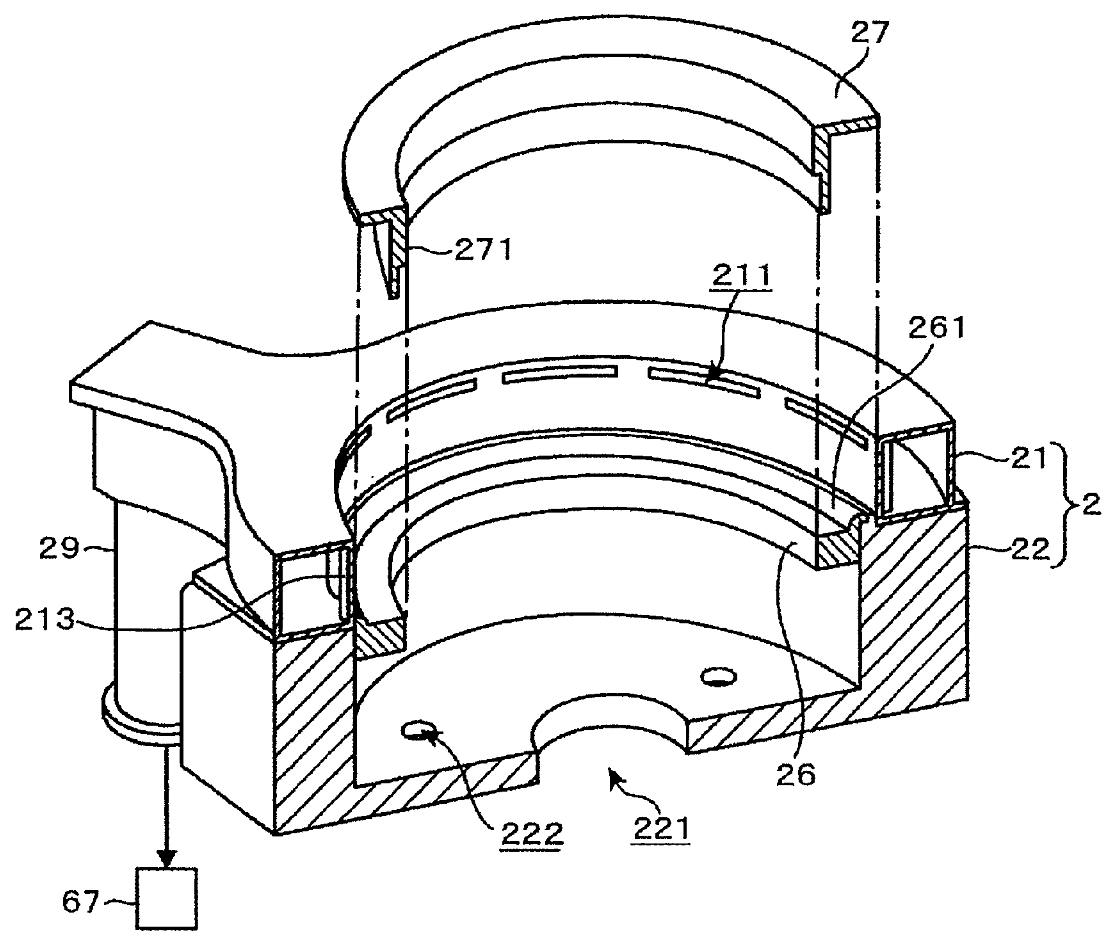
FIG. 2 is a partially exploded perspective view of a process container part of the film deposition apparatus shown in FIG. 1.

As shown in FIGS. 1 and 2, the process container 2 in this embodiment includes the flat bowl-like lower container 22, and an annular exhaust duct 21 superposed on the lower container 22. The lower container 22, which corresponds to the lower part in the claims, is made of, e.g., aluminum. The lower container 22 has a through hole 221 in a bottom surface thereof, through which the support member 33 of the stage 31 can pass. A plurality of, e.g., four purge-gas supply conduits 222 are disposed around the through hole 221. Thus, a purge gas such as a nitrogen gas supplied from a purge-gas supply source 66 can be sent into the lower container 22.

As shown by the broken line in FIG. 1, a sidewall part 223 of the lower container 22 is provided with a transfer opening 28 through which a wafer W is loaded and unloaded by the external transfer mechanism. The transfer opening 28 is opened and closed by a gate valve, not shown. A grease is used for a drive mechanism for the gate valve. The sidewall part 223 of the lower container 22 has such a thickness that the below-described exhaust duct 21 can be superposed thereon. An upper surface of the sidewall part 223 is flat.

The exhaust duct 21 made of, e.g., an aluminum defines a part of a vacuum exhaust conduit. As shown in the longitudinal perspective view (partially exploded perspective view) of FIG. 2, the exhaust duct 21 is an annular body formed by a curved duct having a rectangular cross-section. An inside diameter and an outside diameter of the annular body are substantially the same as an inside diameter and an outside diameter of the sidewall part 223 of the lower container 22. Herein, a wall surface of the exhaust duct 21 which is closer to the process atmosphere is referred to as an inner wall surface, and a wall surface thereof which is more distant from the process atmosphere is referred to as an outer wall surface. As shown in FIG. 2, a plurality of vacuum exhaust ports 211, which are laterally extending slit-like exhaust ports, are circumferentially arranged with intervals therebetween in an upper end part of the inner wall surface. An exhaust pipe 29 constituting a part of the vacuum exhaust conduit is connected to the outer wall surface of the exhaust duct 21 at one certain position, for example. As shown in FIG. 2, by using a vacuum pump 67 connected to the exhaust pipe 29, a gas can be discharged from the vacuum exhaust ports 211 through the exhaust pipe 29 and the exhaust duct 21, so as to create a vacuum.

As shown in FIG. 3, duct heaters 214 constituting the heating unit are disposed on a lower surface and an upper surface of the outer wall surface of the exhaust duct 21. The duct heater 214 is formed of a sheet-like heating resistor, and can heat the overall exhaust duct 21 to, e.g., 230° C. by means of an electric power supplied from the power supply part 68. Thus, the adhesion of the reactant to the inside of the exhaust duct 21 can be prevented. As a matter of convenience, illustration of the duct heaters 214 is omitted excluding FIG. 3. In addition, as shown in FIG. 2, a plurality of support columns 213 for reinforcing the exhaust duct 21 are arranged in the exhaust duct 21 such that the support columns 213 are located at positions between the vacuum exhaust ports 211 that are circumferentially adjacent to each other. As shown in FIG. 1, the upper surface and the lower surface of the outer wall surface of the exhaust duct 21 are covered with a heat insulation member 212 forming a heat insulation part.

A structure of an overlapped part of the lower container 22 and the exhaust duct 21 is described. A projecting part 224 having a horizontal upper surface is formed at an inside part of an upper end surface of the lower container 22 throughout a circumference thereof. On the other hand, an intermediate ring body 252 made of, e.g., aluminum is disposed integrally with the exhaust duct 21 on a lower end part of the inner wall surface of the exhaust duct 21. The projecting part 224 and the intermediate ring body 252 are hermetically joined to each other via an O-ring 253 which is a resin sealing member inserted to a groove formed in the upper surface of the projecting part 224. As a matter of convenience, illustration of the O-ring 253 is omitted excluding FIG. 1.

In this state where the exhaust duct 21 and the lower container 22 are hermetically joined to each other, a gap 254 is defined between the lower surface of the heat insulation member 212 and the outside of the projecting part 224 on the upper surface of the lower container 22. A plurality of support members 251 for supporting the exhaust duct 21 are circumferentially disposed with intervals therebetween in the gap 254 on positions near to the outside. The gap 254 is an air layer in communication with an atmospheric air. The air layer and the heat insulation member 212 constitute the heat insulation part.

As described above, the exhaust duct 21 constituting a portion of an upper part of the process container 2 is superposed on the lower container 22 via the heat insulation part. In other words, the exhaust duct 21 and the lower container 22, which are thermally insulated from each other, integrally constitute the process container 2. Since the plurality of vacuum exhaust ports 211 formed in the inner wall surface of the exhaust duct 21 are opened to an upper space including the process atmosphere 10 formed between the gas showerhead 40 and the stage 31, the process atmosphere 10 can be discharged from the vacuum exhaust ports 211 to create a vacuum in the upper space.

As shown in FIGS. 1 and 2, an inner block 26 that is an annular projecting part is disposed inside the process container 2, in order to separate a lower space, which is a space inside the lower container 22, from the upper space including the process atmosphere 10, the upper space being located above the table 300. The inner block 26 is a ring-like member made of, e.g., aluminum, having such a size that the inner block 26 can be fit in a space between the inner wall surface of the sidewall part 223 of the lower container 22 and the side peripheral surface of the stage 31.

The inner block 26 has an outwardly extending projecting edge 262 on an upper peripheral part thereof. Due to an engagement of the projecting edge 262 with the aforementioned intermediate ring body 252, the whole inner block 26 can be fixed, with the inner block 26 projecting annularly from the inner wall surface of the lower container 22. A height position at which the inner block 26 is fixed is set at a position higher than an upper end of the transfer opening 28, namely, at a position higher than the transfer position for the wafer W, where the wafer W is transferred to and from the external transfer mechanism.

As shown in FIG. 3, two sheath heaters 263 serving as the heating unit are concentrically embedded in an upper surface of the inner block 26, for example. The sheath heaters 263 can heat the inner block 26 to, e.g., 230° C. by means of an electric power supplied from the power supply part 68. Thus, the adhesion of the reactant to the surface of the inner block 26 can be prevented.

At a room temperature, a slight radial gap is formed between the projecting edge 262 of the inner block 26 and the intermediate ring member 252. However, when the inner block 26 is heated by a radiation heat from the stage 31, the inner block 26 is thermally expanded, so that the projecting edge 262 and the intermediate ring body 252 are radially brought into tight contact with each other. Thus, the heat of the inner block 26 is effectively transmitted to the exhaust duct 21, in order not to overheat the inner block 26. As shown in FIGS. 1 and 3, the inner block 26 is covered with a quartz block cover 261, in order to prevent the adhesion (deposit) of the reactant to the surface of the inner block 26.

A positional relationship between the stage 31 and the block cover 261 is described in detail. When the stage 31 is located at the process position, a gap between a side surface of the stage cover 36 (a side surface of the skirt part 361) covering the stage 31 and a side surface of the block cover 261 is 2 mm, for example. Thus, the gas in the process atmosphere is difficult to be diffused therefrom to the lower space. This state is a state in which the upper space and the lower space are separated from each other. The inner block 26 and the quartz block cover 261 constitute a surrounding part that surrounds the table with the gap therebetween.

In addition, a baffle ring 27 is disposed between the vacuum exhaust ports 211 formed in the inner wall surface of the exhaust duct 21 and the process atmosphere 10. The baffle ring 27 is a member for lowering a flow conductance, to thereby cause the process container 2 to be uniformly exhausted in the circumferential direction thereof when viewed from the process atmosphere 10. As shown in FIGS. 1 and 2, the baffle ring 27 is a ring member having an inverted L-shape cross-section. The baffle ring 27 is fixed on a bottom peripheral part of the gas showerhead 40. Thus, an annular projecting part 271 (baffle ring 27) extending downwardly from the peripheral part of the gas showerhead 40 is disposed around the process atmosphere 10. Thus, the gas discharged from the process atmosphere 10 is moved upward toward the exhaust ports 211 through a narrow ring-shaped space 11 formed between the projecting part 271 and the inner block 26. Namely, the exhaust flow from the process atmosphere is bent through the narrow area below the projecting part 271. Thus, the flow conductance of the exhaust flow is lowered.

The film deposition apparatus 1 is equipped with the control device 7 that controls the heating operations of the respective heaters 214, 263, 32, and 47, the gas supply from the gas supply sources 61 to 63, the vertical movement of the stage 31, and so on. The control device 7 is formed of a computer, not shown, including a CPU and a program. The program has a step (command) group required for the film deposition apparatus 1 to control the respective members so as to perform a film deposition process to a wafer W, namely, to perform a control of the heating operations (temperatures) of the respective heaters 214, 263, 32, and 47, a control of supply and stop and supply rates of the gases from the gas supply sources 61 to 63, a control of the upward movement and the downward movement of the stage 31, and so on. Such a program is stored in a storage medium such as a hard disc, a compact disc, a magnetoptical disc, and a memory card, and is generally installed on the control device 7 from the storage medium.

Next, an operation of the film deposition apparatus 1 in this embodiment is described. At first, the gate valve of the transfer opening 28 is opened, and the external transfer mechanism enters from the transfer opening 28 and loads a wafer W into the process container 2. Then, by means of the elevating pins 34, the wafer W is placed on the stage 31 located at the transfer position. The wafer W is statically fixed on the stage 31 by the electrostatic chuck, not shown. At this time, as shown in FIG. 3, the surfaces of the exhaust duct 21 and the inner block 26 are respectively heated to, e.g., 230° C. by the heaters 214, 263 which constitute the heating unit. In addition, the surface of the gas showerhead 40 is heated to, e.g., 250° C. by the heater 47. Then, the gate valve of the transfer opening 28 is closed so as to hermetically seal the process container 2. Thereafter, the process container 2 is vacuumized by the vacuum pump 67 through the exhaust duct 21.

Figure 5:
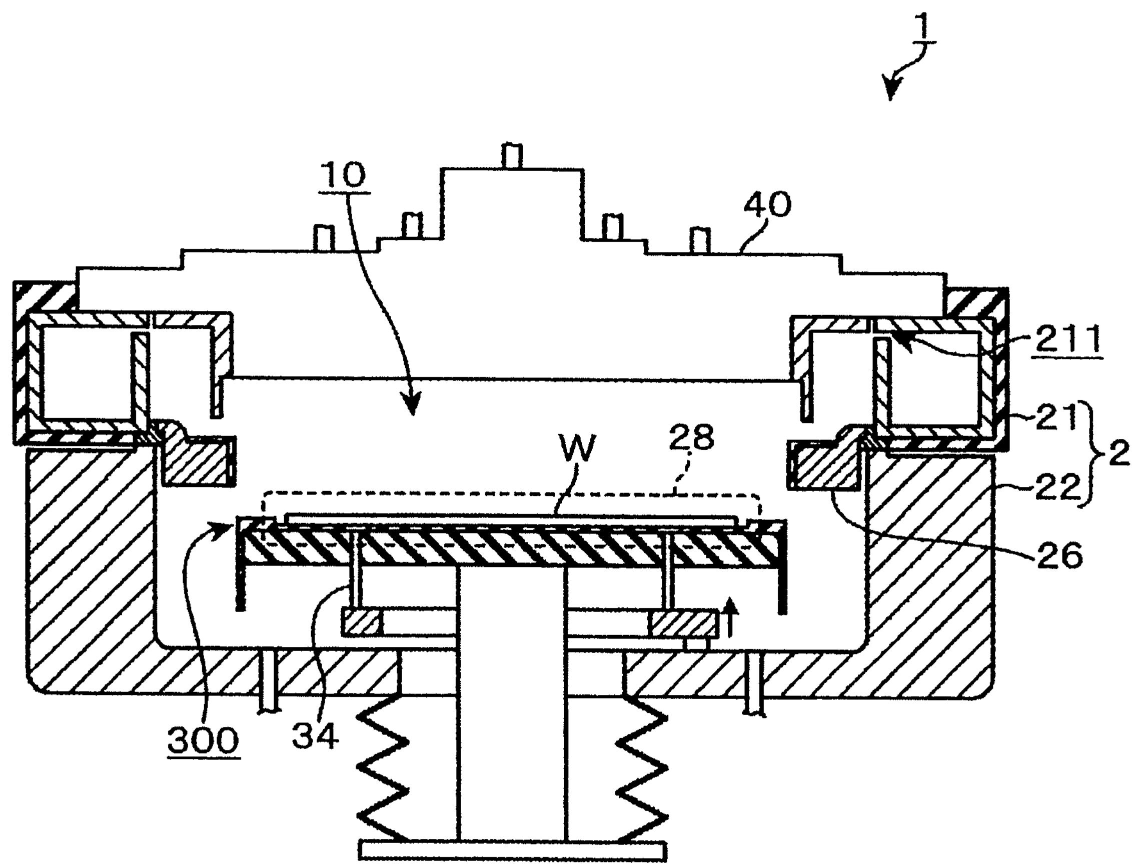
FIG. 5 is a view for explaining an operation of the film deposition apparatus shown in FIG. 1.

At this time, as described above, the inner block 26 is fixed at the position higher than the transfer position for the wafer W. Thus, as shown in FIG. 5, in a state where the stage 31 is lowered and located at the transfer position for the wafer W, the space in the lower container 22 is in communication with the process atmosphere 10 (the space in the lower container 22 is not separated from the process atmosphere 10). Thus, in the aforementioned vacuum evacuation step, the inside space of the entire process container 2 including the inside space of the lower container 22 is evacuated to create a vacuum.

Figure 6A:
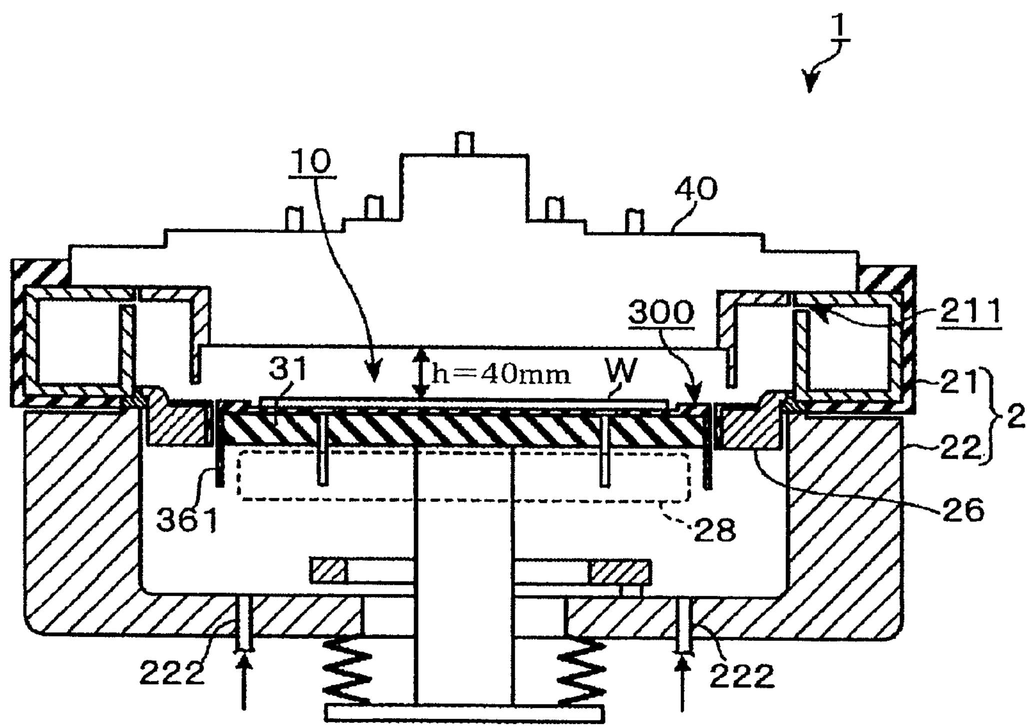
FIGS. 6A and 6B are views for explaining the operation of the film deposition apparatus shown in FIG. 1.
Figure 6B:
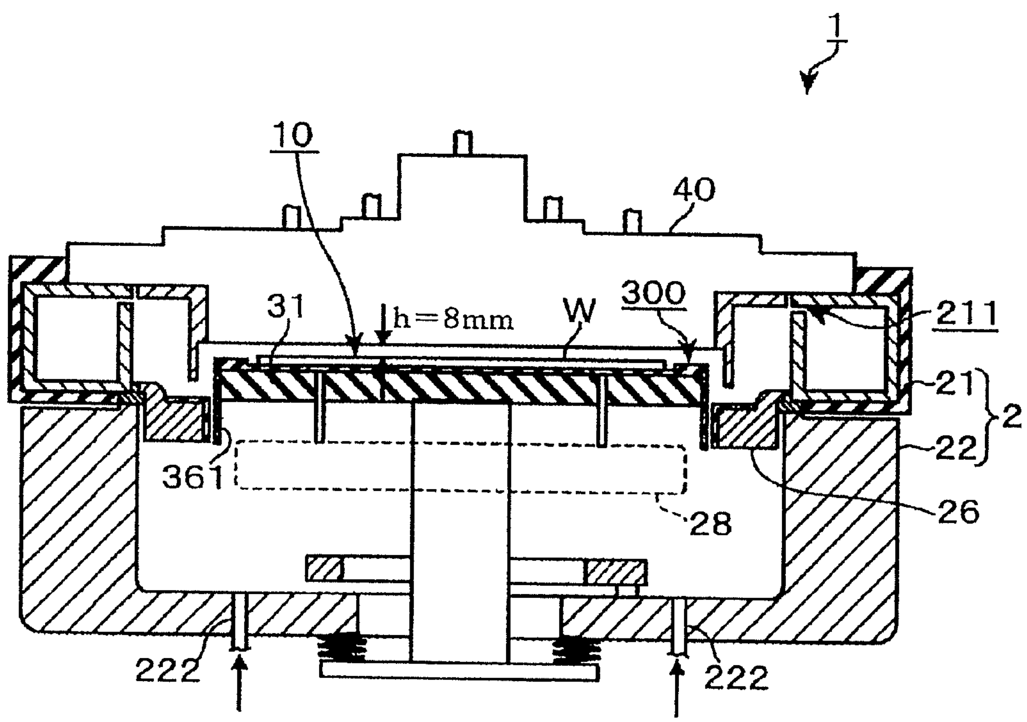

After the pressure in the process container 2 is reduced under a predetermined value, the stage 31 on which the wafer W has been placed is elevated to the process position, while the vacuum evacuation is continued. The film deposition apparatus 1 in this embodiment can vary the process position, i.e., the film deposition apparatus 1 can vary a distance h between the lower surface of the gas showerhead 40 and the upper surface of the wafer W. Specifically, the process position can be vertically varied between the lowermost process position, which is shown in FIG. 6A, at which the distance h is 40 mm (the distance h is the longest), and the uppermost process position, which is shown in FIG. 6B, at which the distance h is 8 mm (the distance h is the shortest). When a volume of the process atmosphere 10 with the distance h being 40 mm is represented as V1, and a volume of the annular space 11 is represented as V2, V1 is smaller than V2 (V1<V2). Under this condition, the gas in the process atmosphere 10 can be quickly sent to the exhaust duct 21, whereby a time required for replacement of gases can be reduced.

A relationship between the distance h between the lower surface of the gas showerhead 40 and the upper surface of the wafer W and the film deposition process is briefly described. As shown in FIG. 6B, when the distance h is shorter, the volume of the process atmosphere 10 is smaller. Thus, the amounts of the respective gases to be used can be saved. In addition, a time required for purging the process atmosphere 10 can be reduced, whereby a time required for the overall film deposition process can be reduced. On the other hand. when a distance between the respective material-gas supply holes 401, 402 and the wafer W is excessively short, there is a possibility that the shapes (patterns) of the supply holes 401, 402 might be transferred onto a film to be deposited. In this case, a film thickness of the deposited film becomes non-uniform.

In order to cope with this problem, the film deposition apparatus 1 in this embodiment previously stores respective optimum process positions corresponding to respective recipes which specify the respective film deposition conditions. Thus, the stage 31 is always elevated to the optimum process position which is specified by one of the recipes selected for the film deposition process.

Based on the above operation control, the stage 31 is elevated from the transfer position shown in FIG. 5 to the process position shown in FIG. 6A or 6B, so that the side peripheral surface of the stage cover 36, or the skirt part 361 extending from the side peripheral surface, is surrounded by the inner block 26. Thus, the upper space (including the process atmosphere 10), which is located above the stage 31, and the lower space, which is the inside space of the lower container 22, are separated from each other by the stage 31 and the inner block 26.

After the upper space and the lower space have been separated from each other, there is started introduction of the purge gas into the lower container 22 through the purge-gas supply conduits 222. Then, a temperature of the wafer W is heated to, e.g., 280° C. by the stage heater 32. Thereafter, an STO film deposition process is started. In FIGS. 5, 6, and 8, illustration of the stage heater 32 is omitted as a matter of convenience. In the following description, the process position for the wafer W is assumed to be the position shown in FIG. 6A.

Figure 7:
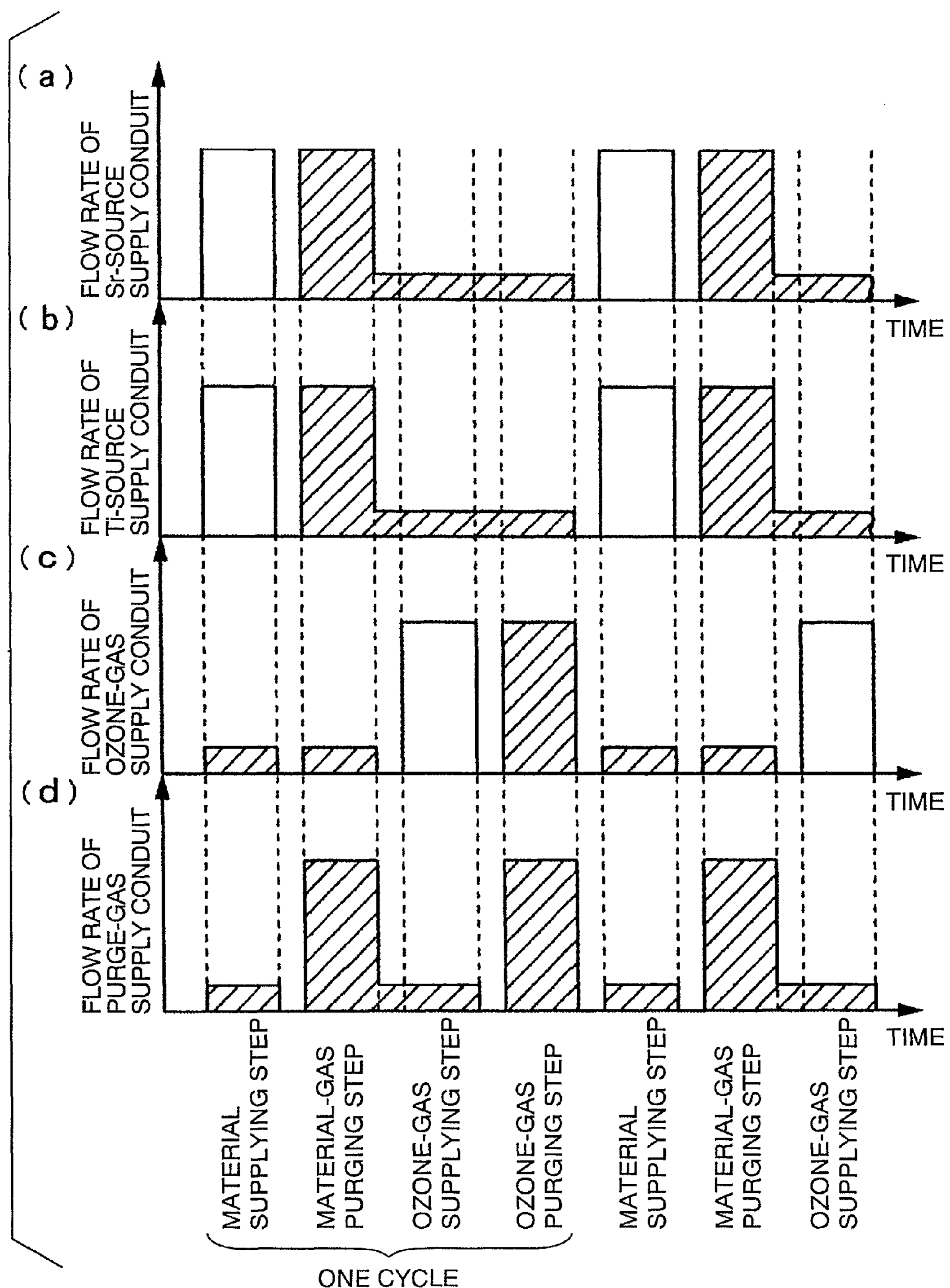
FIG. 7 is a view of a gas supply sequence in a film deposition process performed by the film deposition apparatus shown in FIG. 1.

The STO film deposition process by the ALD method is performed based on a gas supply sequence shown in FIG. 7. Unpatterned columns shown in (a) to (c) of FIG. 7 show flow rates of the process gases (Sr material, Ti material, and ozone gas) flowing through the respective gas supply conduits 51 to 53. On the other hand, hatched columns shown in (a) to (d) of FIG. 7 show supply rates of the purge gas flowing through the respective gas supply conduits 51 to 54.

Figure 8A:
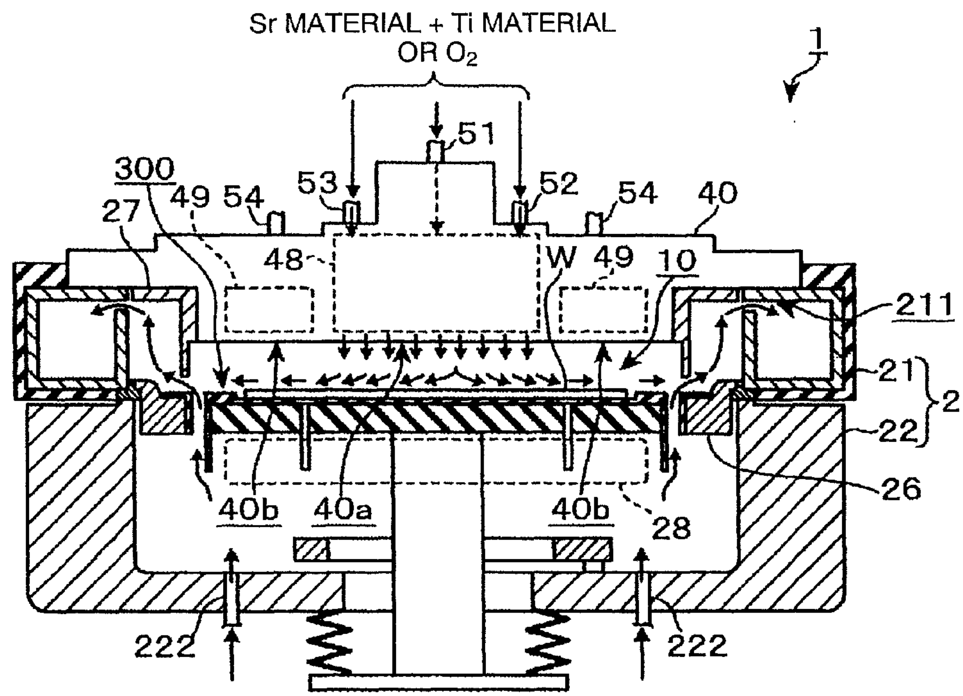
FIGS. 8A and 8B are views for explaining the operation of the film deposition apparatus shown in FIG. 1.
Figure 8B:
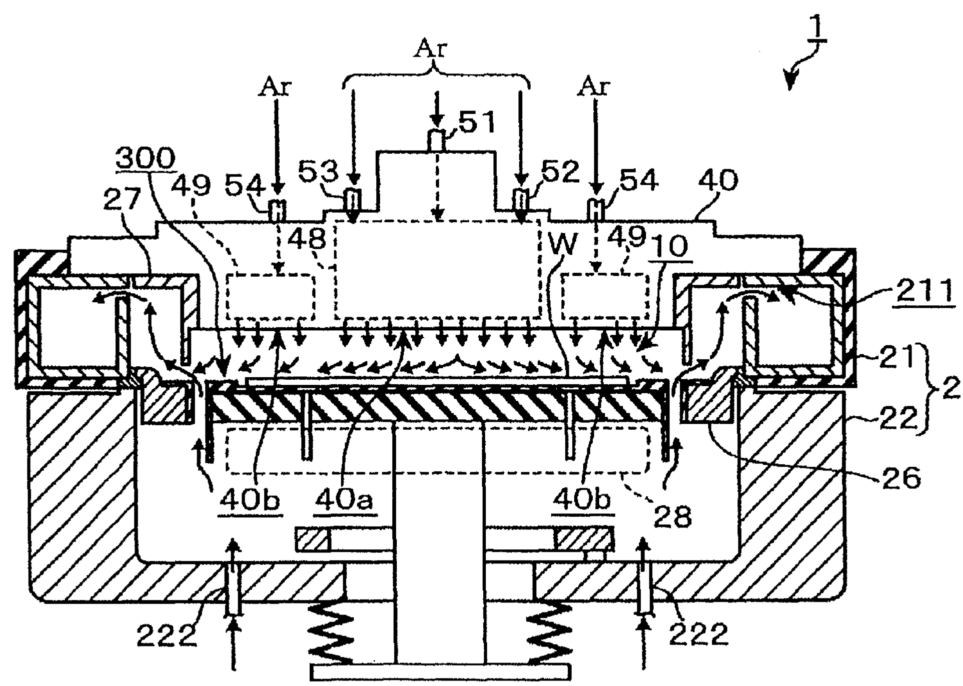

FIGS. 8A and 8B schematically show flows of the respective gases in the film deposition apparatus 1 during the sequence. As a matter of convenience, in FIGS. 8A and 8B, the respective gas supply spaces 41 to 43 and the respective gas supply holes 401 to 403 for supplying the gases to the central area 40*a* are collectively represented as a process-gas supply mechanism 48 by the broken lines, and the purge-gas supply conduit 54 and the purge-gas supply hole 404 are collectively represented as a purge-gas supply mechanism 49 by the broken lines.

As shown in (a) and (b) of FIG. 7, supply of the Sr material and supply of the Ti material are simultaneously performed (material-gas supplying step). As shown in (c) and (d) of FIG. 7, a slight amount of purge gas is supplied from each of the ozone-gas supply conduit 53 and the purge-gas supply conduit 54, in order to prevent a backflow of the material gas. At this time, as shown in FIG. 8A, the Sr material and the Ti material are independently supplied through the separated supply holes 401 and 402 from the central area 40*a* of the gas showerhead 40, the both materials are mixed (post-mixed) with each other in the process atmosphere 10, and the mixture of the materials reaches the central part of the wafer W. Since the vacuum exhaust ports 211 formed in the exhaust duct 21 are arranged so as to surround the process atmosphere 10, the material gases having reached the central part of the wafer W flow from the central part of the wafer W to the peripheral part thereof toward the vacuum exhaust ports 211. Since the material gases flow from the central part of the wafer W to the peripheral part thereof, a moving distance of the material gases becomes shorter, so that molecules of the respective material gases can be adsorbed by the wafer W uniformly in the radial direction thereof.

As described above, disposed on the inlet (inside) of the ring-like space 11 is the baffle ring 27 for lowering the flow conductance of the space from the process atmosphere 10 to the vacuum exhaust ports 211. Thus, as shown in FIG. 2, even when the gas is discharged from the respective vacuum exhaust ports 211 through the exhaust pipe 29 disposed at the one position of the exhaust duct 21, a suction force to the process atmosphere 10 is uniformized in the circumferential direction of the process container 2 (vacuum exhaust ports 211). Thus, the flow of the material gases flowing from the central part of the wafer W to the peripheral part thereof is uniformized in the circumferential direction of the wafer W, without any deviation. Therefore, the molecules of the material gases can be adsorbed by the wafer W uniformly in the circumferential direction thereof, whereby a uniform adsorption layer can be formed on the overall surface of the wafer W.

In the film deposition apparatus 1 in this embodiment, when the respective material gases (first process gas) are supplied to the process atmosphere 10, the upper space including the process atmosphere 10 and the lower space being the inside space of the lower container 22 are separated from each other by the stage 31 and the inner block 26. Thus, the material gases are prevented from flowing into the lower space being the inside space of the lower container 22, whereby the adhesion of the reactant to the lower space can be prevented. In particular, the purge gas is supplied to the lower container 22 from the purge-gas supply conduits 222, and the gases in the process atmosphere 10 are discharged via the vacuum exhaust ports 211. Thus, as shown in FIG. 8A, a flow of the purge gas flowing from the lower container 22 toward the vacuum exhaust ports 211 is formed in the gap between the stage 31 and the inner block 26. Thus, the effect of preventing the material gases from flowing into the lower container 22 is further enhanced. A supply rate of the purge gas, which is supplied from the purge-gas supply conduits 222 to flow through the gap between the stage 31 and the inner block 26, is adjusted such that a Peclet number Pe is not less than 20 ($Pe \geqq 20$). In this case, inflow of the material gases toward the lower container 22, which might be caused by a reverse diffusion, can be effectively prevented. Herein, $Pe = Vs \cdot Ls/D$, in which Vs represents a flow speed of the purge gas flowing through the gap between the stage 31 and the inner block 26, Ls represents a length of the gap, and D represents a diffusion constant of the material gases.

On the other hand, the members defining the flow space (the process atmosphere 10, the ring-shaped space 11 between the baffle ring 27 and the inner block 26, and the inside space of the exhaust duct 21), in which the material gases flow, are provided with the respective heaters 214, 263, 32, and 47 for heating their regions exposed to the flow space. The regions exposed to the flow space are heated by these heaters to a temperature higher than a temperature allowing the adhesion of the reactant. Thus, the adhesion of the reactant can be prevented. A temperature of the regions exposed to the flow space is heated to at least 200° C. or more, preferably 230° C. or more, and more preferably 250° C. or more.

After a predetermined time has passed and the adsorption layer of the material gases has been formed on the wafer W, the supply of the material gases is stopped. As shown in FIGS. 7(*a*), 7(*b*), and 7(*d*), the purge gas is supplied from the Sr-material supply conduit 51, the Ti-material supply conduit 52, and the purge-gas supply conduit 54, so that the material gases remaining in the process atmosphere 10 and in the process-gas supply mechanism 48 are purged (material-gas purging step). In addition, as shown in FIG. 7(*c*), a slight amount of purge gas is supplied from the ozone-gas supply conduit 53. At this time, as shown in FIG. 8B, in the process container 2, the purge gas is simultaneously supplied from both the central area 40*a* of the gas showerhead 40 and the peripheral area 40*b* thereof. Thus, a larger amount of the purge gas is supplied as compared with a case in which the purge gas is supplied from only one of these areas. Thus, the material gases can be purged for a shorter time. In addition, also during this operation, the process atmosphere 10 and the lower space inside the lower container 22 are separated from each other by the stage 31 and the inner block 26, as well as the purge gas flows through the gap between the stage 31 and the inner block 26. Thus, there is almost no possibility that the material gases to be discharged flows into the lower container 22.

As shown in FIGS. 7(*a*), 7(*b*), and 7(*d*), even after the gases of the process atmosphere 10 have been purged, the purge gas is slightly continuously supplied from the Sr-material supply conduit 51, the Ti-material supply conduit 52, and the purge-gas supply conduit 54 (thus, the ozone gas to be subsequently supplied is prevented from entering the process-gas supply mechanism 48). Then, as shown in FIG. 7(*c*), the ozone gas is supplied from the ozone-gas supply conduit 53 (ozone-gas supplying step). At this time, as shown in FIG. 8A, in the process container 2, the ozone gas is supplied into the process atmosphere 10 in substantially the same manner as the material gases. Then, the material gases in the adsorption layer having adsorbed on the surface of the wafer W and the ozone gas react with each other by a heat energy from the stage heater 32, whereby an STO molecular layer is formed.

After the ozone gas has been supplied for a predetermined time, the supply of the ozone gas is stopped. Then, as shown in FIGS. 7(*c*) and 7(*d*), the purge gas is supplied form the ozone-gas supply conduit 53 and the purge-gas supply conduit 54, so that the ozone gas remaining in the process atmosphere 10 and in the process-gas supply mechanism 48 is purged (ozone-gas purging step). As shown in FIGS. 7(*a*) and 7(*b*), a slight amount of purge gas is continuously supplied form the Sr-material supply conduit 51 and the Ti-material supply conduit 52. At this time, in the process container 2, the purge gas flows along substantially the same path as the path shown in FIG. 8B, and the ozone gas remaining in the process atmosphere 10 can be discharged for a relatively short time.

As shown in FIG. 7, one cycle including the aforementioned four steps is repeated predetermined times, e.g., 100 times. Thus, the multiple STO molecular layers are stacked, whereby deposition of an STO film having a predetermined film thickness is completed. As described above, in the material-gas supplying step, the material-gas purging step, the ozone-gas supplying step, and the ozone-gas purging step, it is effective that a slight amount of purge gas is invariably made flow from the gas supply conduits other than the gas supply conduit from which a large amount of gas is supplied.

According to the film deposition apparatus 1 in this embodiment, the following effects can be produced.

Due to the provision of the inner block 26 that surrounds the table 300 located at the process position, the upper space including the process atmosphere and the lower space therebelow can be separated from each other, whereby the gas in the process atmosphere is difficult to flow therefrom into the lower space. In addition, since the purge gas is supplied to the lower space, the gas in the process atmosphere is further prevented from flowing through the gap between the inner block 26 and the table 300 and diffusing inside the lower space. Thus, it is not necessary to heat the lower container 22 to a high temperature in order to prevent the adhesion of the reactant. In addition, in order that the lower container 22 is thermally separated, the lower container 22 and the exhaust duct 21 are thermally insulated from each other, and a joining area of a joining part between the inner block 26 and the lower container 22 is made small. Thus, the lower container 22 can be maintained at, e.g., a normal temperature (at least, unlike the exposed regions of the upper space, the lower container 22 will not be heated to such a high temperature).

The transfer opening 28, which is opened and closed by the gate valve, is disposed in the "cool" lower container 22. Thus, there is no possibility that the grease of the drive system for the gate valve of the transfer opening 28 and the grease of the drive system for vertically moving the table 33 are thermally deteriorated. In addition, although not shown, the manometer for measuring a pressure in the process container 2 is disposed on the lower container 22. However, the problem of the heat resistance limit of the manometer is not caused, so that there is no trouble in measuring a pressure in the process container 2. Further, since it is not necessary to heat the entire process container 2, an amount of the energy required for heating can be advantageously reduced.

In addition, a gas is supplied to the wafer W from the gas showerhead 40, and the gas is discharged from the vacuum exhaust ports 211 surrounding the process atmosphere. Thus, even when a purge gas is supplied at a large flow rate upon switching from one gas to another gas in the ALD method, the purge gas can be rapidly discharged. Thus, the switching operation of the process gases in the ALD method can be accelerated, to thereby improve the throughput.

In the aforementioned film deposition apparatus 1, there has been described the example in which an STO film is deposited by using the Sr material and the Ti material as the first process gas (material gas) and the ozone gas as the second process gas (reaction gas). However, a kind of film to be deposited by the film deposition apparatus 1 is not limited to the STO film. For example, the present invention can be applied to a process in which a thin zirconium-oxide film is deposited by using TEMAZ as a material gas and an ozone gas and/or a steam as a reaction gas. Moreover, a kind of method to be performed by the film deposition apparatus 1 is not limited to the ALD method and the MLD method. The film deposition apparatus according the present invention can be applied to the general CVD method that continuously supplies a material gas and a reaction gas.

Figure 9:
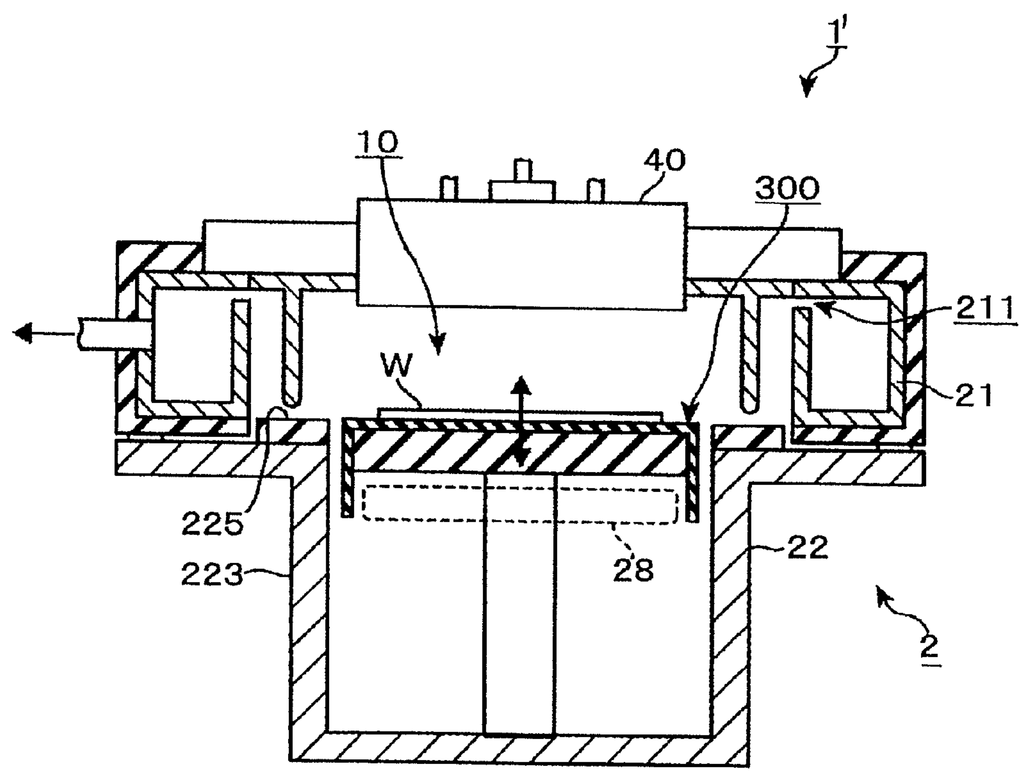
FIG. 9 is a longitudinal sectional view of a modification of the film deposition apparatus shown in FIG. 1.
Figure 10:
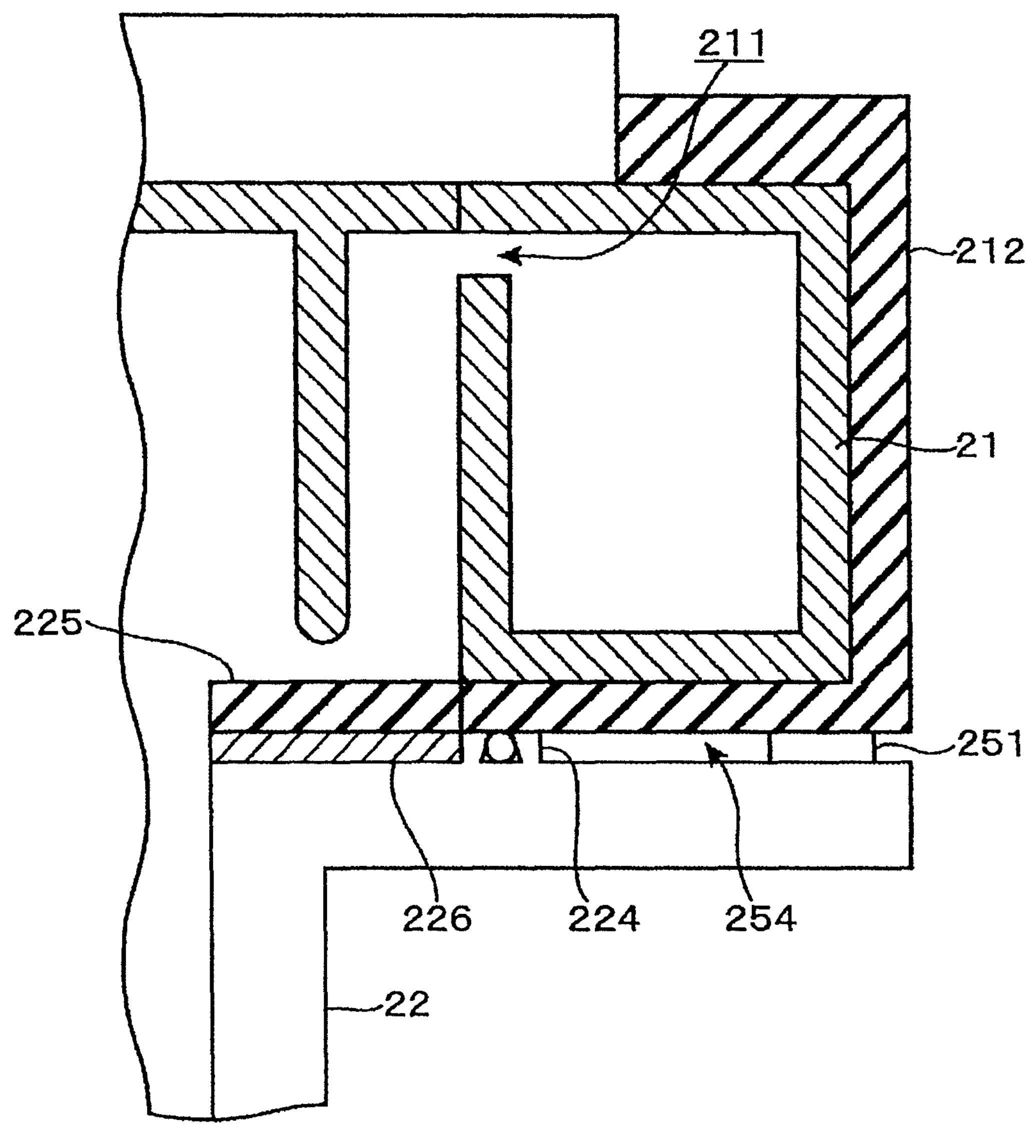
FIG. 10 is an enlarged view of the film deposition apparatus shown in FIG. 9.

In the above embodiment, since the inner block 26 annularly projects from the inner wall of the process container 2 and the side peripheral surface of the stage 31 is almost in contact with the inside periphery of the inner block 26, the process atmosphere 10 and the inside space of the lower container 22 are separated from each other. However, these spaces can be separated from each other without providing the inner block 26. For example, in a film deposition apparatus 1' shown in FIG. 9, a diameter of the sidewall part 223 of the lower container 22 is reduced, whereby the sidewall part 223 comes close to the side peripheral surface of the stage 31 so as to form a "surrounding part". Also in this embodiment, the process atmosphere 10 and the space inside the lower container 22 can be separated from each other. In this case, as shown in the enlarged view of FIG. 10, the upper surface of the lower container 22 is a region exposed to a gas. Thus, such a region is covered with a quartz cover member 225, for example. A heater 226 as a heating unit is disposed on a lower surface of the cover member 225. Thus, the adhesion of the reactant to the upper surface of the lower container 22 can be prevented.

The invention claimed is:

1. A film deposition apparatus configured to deposit a film on a substrate, the film deposition apparatus comprising:

a vacuum container having a transfer opening;

a table disposed in the vacuum container, on which a substrate loaded into the vacuum container via the transfer opening can be placed;

a process-gas supply part disposed in an upper part of the vacuum container so as to be opposed to the table, and configured to supply a process gas to the substrate placed on the table;

an elevating mechanism configured to vertically move the table between a process position at which the substrate is subjected to a film deposition process, and a transfer position at which the substrate is transferred to and from an external transfer mechanism that has entered from the transfer opening;

a surrounding part configured to surround the table with a gap therebetween, when the table is located at the process position, so that the surrounding part and the table divide an inside of the vacuum container into an upper space, which is located above the table, and a lower space, which is located below the table;

a vacuum exhaust conduit having an exhaust duct disposed along a circumference of the upper space and having an exhaust port through which a process atmosphere in the upper space is discharged to create a vacuum in the upper space;

a purge-gas supply conduit configured to supply a purge gas into the lower space so that the purge gas flows into the upper space via the gap between the table and the surrounding part;

a heating unit configured to heat a gas contact region ranging from the upper space to the vacuum exhaust conduit, to a temperature higher than a temperature allowing adhesion of reactant; and a heat insulation part disposed between the heating unit and a lower part of the vacuum container.

2. The film deposition apparatus according to claim 1, wherein the gas contact region includes the table, the process-gas supply part, the surrounding part and the exhaust duct.

3. The film deposition apparatus according claim 1, wherein the surrounding part is formed of an annular projecting part annularly projecting inward from an inner wall of the vacuum container, the surrounding part being configured to be located near to a side peripheral surface of the table so as to surround the same, when the table is located at the process position.

4. The film deposition apparatus according to claim 1, wherein the exhaust duct is formed to have an annular shape surrounding the upper space.

5. The film deposition apparatus according to claim 1, wherein the exhaust port is formed to have a laterally extending slit-like shape.

6. The film deposition apparatus according to claim 1, wherein an exhaust pipe for vacuum evacuation is connected to the exhaust duct.

7. The film deposition apparatus according to claim 1, wherein a heat insulation member as the heat insulation part is disposed on a lower surface of the exhaust duct.

8. The film deposition apparatus according to claim 1, wherein the lower part of the vacuum container is formed as a flat lower container having an upper opening.

9. The film deposition apparatus according to claim 8, wherein a member, which is positioned immediately above the lower container so as to constitute an upper part of the vacuum container, is in contact with an inward area of an upper end surface of the lower container via a sealing member, and a gap forming an air layer constituting the heat insulation part is formed between the member constituting the upper part of the vacuum container and an outward area of the upper end surface of the lower container.

10. The film deposition apparatus according to claim 1, wherein a temperature of the region to be heated by the heating unit is 230° C. or more.

11. The film deposition apparatus according to claim 1, wherein the upper space is provided with a member for lowering a flow conductance to the vacuum exhaust conduit so as to uniformize the exhaust flow.

12. The film deposition apparatus according to claim 1, wherein the table includes a table body, and a cover member capable of being removably laid on the table body.

13. The film deposition apparatus according to claim 1, wherein supplying a material gas as a process gas so as to cause the gas to be adsorbed on the substrate, and supplying a reaction gas as a process gas reactable with the material gas so as to generate a reaction product on the substrate, are alternately performed, and between the supply of the material gas and the supply of the reaction gas, supplying a purge gas as a process gas so as to purge the process atmosphere is performed.

* * * * *